United States Patent [19]

Riggle

[11] Patent Number: 5,588,011
[45] Date of Patent: Dec. 24, 1996

[54] TUNED VITERBI DETECTOR AND EQUALIZER SYSTEM

[75] Inventor: C. M. Riggle, 12995 Morris Trail, Colorado Springs, Colo. 80908-3232

[73] Assignee: C. M. Riggle, Colorado Springs, Colo.

[21] Appl. No.: 596,927

[22] Filed: Feb. 5, 1996

Related U.S. Application Data

[63] Continuation of Ser. No. 288,475, Aug. 10, 1994, abandoned.

[51] Int. Cl.$^6$ .............................. G06F 11/10; G11B 5/09
[52] U.S. Cl. ........................... 371/43; 375/262; 375/341; 375/265; 360/46
[58] Field of Search .................................. 360/46, 48, 49, 360/65; 375/341, 262, 265, 340; 371/43

[56] References Cited

U.S. PATENT DOCUMENTS

| | | | |
|---|---|---|---|
| 5,321,559 | 6/1994 | Nguyen et al. | 360/46 |
| 5,327,440 | 7/1994 | Fredrickson et al. | 371/43 |
| 5,331,320 | 7/1994 | Cideciyan et al. | 341/56 |
| 5,345,342 | 9/1994 | Abbott et al. | 360/48 |
| 5,384,671 | 1/1995 | Fisher | 360/49 |

*Primary Examiner*—W. Chris Kim
*Assistant Examiner*—Regina Neal
*Attorney, Agent, or Firm*—Sheridan Ross & McIntosh

[57] ABSTRACT

A finite impulse response (FIR) filter and a Viterbi detector system for a magnetic read channel are disclosed. The FIR equalizer generates equalized sampled outputs to the Viterbi detector system. The Viterbi detector system determines the most probable value of all references, $R_i$, by accumulating a summation of data sample values, $D_i$, for selected legal bit sequences over a significant amount of random data. The summation and count of data samples are output to a system microprocessor for calculation of an average reference for each path of the Viterbi system. The Viterbi detector system also calculates, in real time, magnitude of differences between the output data received from the FIR equalizer and transition references for each data sample to generate transition metrics, adds transition metrics to state metrics from the source node of two paths, and compares the result. The lesser of the two results yields the most likely correct state metric. Encoded bit strings of finite length are updated and saved for each state. Data is output from an arbitrary bit string.

37 Claims, 10 Drawing Sheets

TUNED VITERBI DETECTOR AND EQUALIZER SYSTEM

This is a continuation of application Ser. No. 08/288,475, filed on Aug. 10, 1994, now abandoned.

FIELD OF THE INVENTION:

The present invention relates to magnetic recording of data, and more specifically, to a tuned Viterbi detector and equalizer read channel.

BACKGROUND OF THE INVENTION:

In general, magnetic disk drives utilize read and write channels to write and retrieve information from magnetic medium. In order to improve the recording density of the data storage system enhanced equalization and data detection systems are sometimes employed. One such scheme is the use of partial response equalization and Viterbi decoding or detecting in the read channel.

The read channels for magnetic disk drives sometimes employ a strategy of peak position detection with simultaneous amplitude qualification. Such read channels for magnetic disk drives are suitable if the inter symbol interference (ISI) is largely removed by an equalization system and if the signal to noise ratio (SNR) is adequate following such equalization. The adequacy is a function of the tolerable error rate within the overall read system. For example, if error correction capability increases, then the SNR may be decreased while still providing adequate overall system performance. In such reading systems, noise is boosted by equalization thereby decreasing SNR. As recording densities increase, the inter symbol interference becomes larger and it contains a larger portion of non-linear ISI which cannot be effectively removed by equalization. In any case, SNR decreases causing an overall degradation in error rate performance.

Some magnetic disk drives employ a technique known as partial response maximum likelihood (PRML) detection. In most cases, the PRML detection systems utilize some form of Viterbi detector. In general, density gain is achieved in PRML in two ways: Viterbi detectors tolerate larger amounts of ISI thereby minimizing equalization noise boost, and Viterbi detectors are inherently more robust than peak detectors.

One problem associated with utilizing PRML systems is achieving well controlled partial response pulse shapes at the output of the equalizer. The ability to achieve well controlled pulse shapes at the output of the equalizer is typically dependent upon the existence of mostly linear ISI (i.e. created from so called linear superposition of pulse shapes), and it requires sufficiently complex equalizers that generate the partial response pulse shapes. The classical Viterbi detector depends upon discrimination between amplitude levels, which are characteristic of linear ISI, from superimposed partial response pulse shapes.

The use of high linear densities in magnetic recording systems results in the ISI having a large non-linear component. Consequently, classical PRML error rate performance is thereby significantly degraded below the level of performance obtained if the ISI was entirely linear. Furthermore, the cost in logic complexity and power consumption for constructing long finite impulse response (FIR) equalizers to create the best possible pulse shapes is an undesirable burden. Therefore, compromises are typically made in equalizer complexity, including both length and precision, to limit the amount of logic and power consumption. It is highly desirable to develop an equalizer and detector system that is less demanding in terms of perfection in equalizer output.

The PRML systems have been used in magnetic disk drives as well as other applications. One such system for disk drives uses a PR IV (partial response, class IV) pulse shape and a 0,4 recording code. In such PRML systems, the Viterbi decoder was matched to the particular pulse shape and code selected. The PR IV and 0,4 recording code permitted a simple Viterbi decoder with excellent bandwidth. However, no compensation for non-linear ISI was incorporated.

Other disk drive systems have employed more elaborate PRML systems based on a 1,7 recording code and selectably either an EPR IV (extended partial response, class IV) or $E^2$PR IV pulse shapes. These disk drive systems included a Viterbi decoder to match the equalizer. The equalizer contains taps added to partially correct for pole tip undershoots, which are characteristic of widely used thin film recording heads. However, the system does not compensate for non-linear ISI except by use of a modest degree of target shape compensation.

SUMMARY AND OBJECTS OF THE INVENTION

Therefore, it is an object of the present invention to provide a Viterbi detector system to accommodate both non-ideal pulse shapes and non-linear inter symbol interference by using tunable reference amplitude levels.

It is a further object of the present invention to provide an equalizer system with reduced complexity while maintaining a high level of performance.

These and other objects are realized in a read channel system including a finite impulse response (FIR) equalizer, a Viterbi detector system containing tunable references and a system for gathering data such that references can be tuned. The FIR equalizer outputs equalized sampled data to the Viterbi detector system. The Viterbi detector system contains transition metric calculators, a Viterbi add/compare/select (ACS) unit, a Viterbi memory unit, a transition reference measurement unit, and a pulse capture unit. The transition reference measurement unit permits calculation of the most probable value of all references, $R_i$ by accumulating a summation of data sample values, $D_t$, for selected legal bit sequences over a significant amount of random data. The summation and count of data samples are output to a system microprocessor for calculation of an average reference for each path (each legal bit sequence) of the Viterbi system.

The sampled data from the FIR equalizer is input to the transition metric calculators. The transition metric calculators calculate, in real time, magnitudes of differences between the output data received from the FIR equalizer and transition references for each data sample to generate transition metrics. For each state in the Viterbi trellis, the Viterbi ACS unit adds transition metrics to state metrics from the source nodes of two paths which lead into the state, and compares the result. The lesser of the two results yields the most likely correct new state metric. The Viterbi memory unit stores bit strings of finite length that are updated and saved for each state. Data is output from an arbitrary bit string.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

Figure 1:
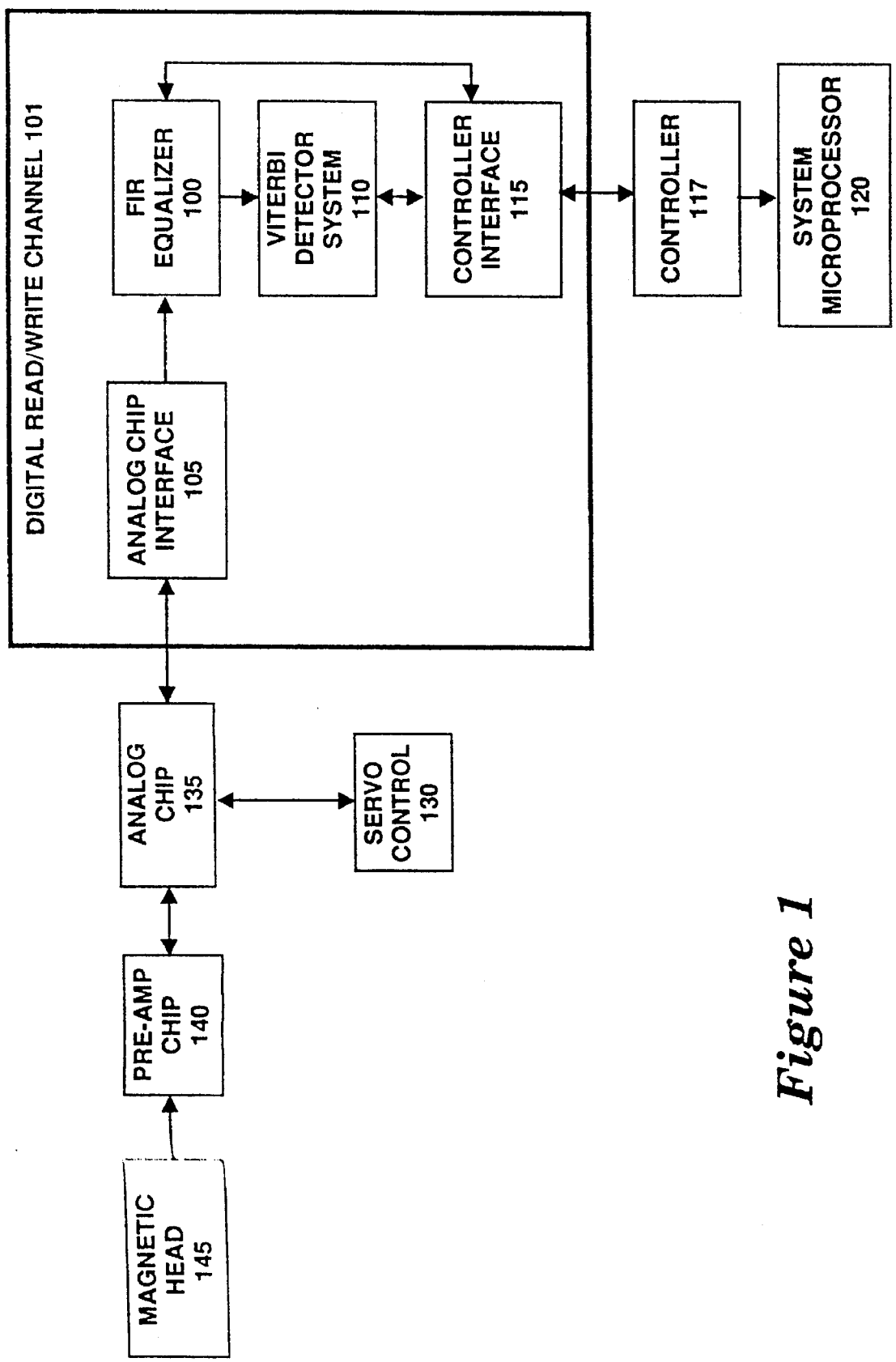
FIG. 1 is a high level block diagram illustrating a magnetic disk drive system.

FIG. 1 is a high level block diagram illustrating a magnetic disk drive system configured in accordance with one embodiment of the present invention. The magnetic disk drive system includes a digital read/write channel 101 as well as other digital and analog disk drive system components. The disk drive system components include an analog chip 135, servo controller 130, pre-amplifier 140, and one or more magnetic heads 145. In some embodiments, the analog chip 135 requires digitized data outputs. The analog chip 135, servo controller 130, pre-amplifier 140, and magnetic heads 145 are those devices typically contained within a disk drive system, and are intended to represent a broad category of disk drive system components, which are well known in the art and will not be described further.

The magnetic disk drive system is coupled to a system microprocessor 120 via a controller 117. The system microprocessor 120, in conjunction with the controller chip, controls the transfer of data for reading and writing information to the magnetic disk drive system. As is explained more fully below, the system microprocessor 120 is also utilized to calculate reference levels for use in the read/write channel 101.

The digital read/write channel 101 incorporates the tuned Viterbi detector and equalizer system of the present invention. Specifically, the digital read/write channel 101 contains the finite impulse response (FIR) equalizer 100 and a Viterbi detector system 110. In order to interface with a data processing system, the digital read/write channel 101 contains a controller chip interface 115. The digital read/write channel 101 also includes an analog chip interface 105 to couple the digital read/write channel 101 to the analog system components.

As is explained more fully below, the present invention utilizes non-fixed and non-classical amplitude reference levels for the calculation of transition metrics for the Viterbi detector system 110. Each path in the Viterbi trellis has a corresponding reference level (e.g. instead of using one of 7 "ideal" levels). Each reference level is independently "tuned" to accommodate both non-ideal pulse shapes and considerable amounts of nonlinear ISI. The tuning of the reference levels is accomplished by measuring the most nearly "perfect" levels (the statistically mean levels) that exist for real data at the output of the FIR equalizer 100. The Viterbi detector 110 utilizes these perfect levels as references for use in transition metric calculations.

The present invention includes a PRML system and an improved Viterbi detector. In one embodiment, the PRML system is implemented with a $E^2PR$ IV pulse shape and a 1,7 recording code. The tuned Viterbi detector and equalizer system exhibit significant improvements over the classical Viterbi detector such that a superior error rate performance, as a function of signal to noise ratio (SNR), is achieved over existing systems when significant amounts of non-linear ISI exist. In addition, the tuned Viterbi detector and equalizer system of the present invention is implemented with lower FIR equalizer complexity and probably overall lower complexity than traditional $E^2PR$ IV Viterbi detector equalizer systems. The overall system has also been optimized in many other ways to achieve a balanced system of minimum complexity without significant sacrifices in performance. These optimizations include: equalizer precision and length; precision and choice of algorithm for calculation of transition metrics; Viterbi add/compare/select (ACS) precision; ACS overflow protection; and memory unit length.

FINITE IMPULSE RESPONSE (FIR) EQUALIZER:

In one embodiment, the equalizer 100 is constructed as a finite impulse response (FIR) filter or transversal structure. The mathematical representation for the FIR filter of equalizer 100 is described as:

$$D_t = \sum_{k=Kmin}^{Kmax} E_k \cdot C_{t-k},$$

wherein:

$D_t$ is the equalized output sample at time t;

$C_{t-k}$ is the input data sample at time t-k;

$E_k$ are the equalizer tap coefficients.

The number of equalizer coefficients $E_k$ range from $K_{min}$ to $K_{max}$. If taps are sparse, in that the spacings are not equal, then some $E_k$ coefficients are set to zero. In one embodiment, the number of non-zero tap coefficients are set to four with equal single cell spacing. The use of four taps provides a tradeoff with using more taps such that the use of four taps provides a reduction in power with only a small sacrifice in performance. This potential tap reduction is due in part to the use of tunable references.

In one embodiment, two of the four tap coefficients are adjustable so that optimum equalization is achieved for each magnetic head/media combination at each recording zone or sub-zone. The tap coefficients may be calculated either adaptively or algorithmically. In one embodiment, an adaptive approach is utilized because the adaptive approach is very fast and requires little firmware support. In order to achieve best equalization, the calculated tap weights are loaded each time a new head, zone, or sub-zone is selected by the microprocessor 120 in the magnetic drive system.

Figure 2:
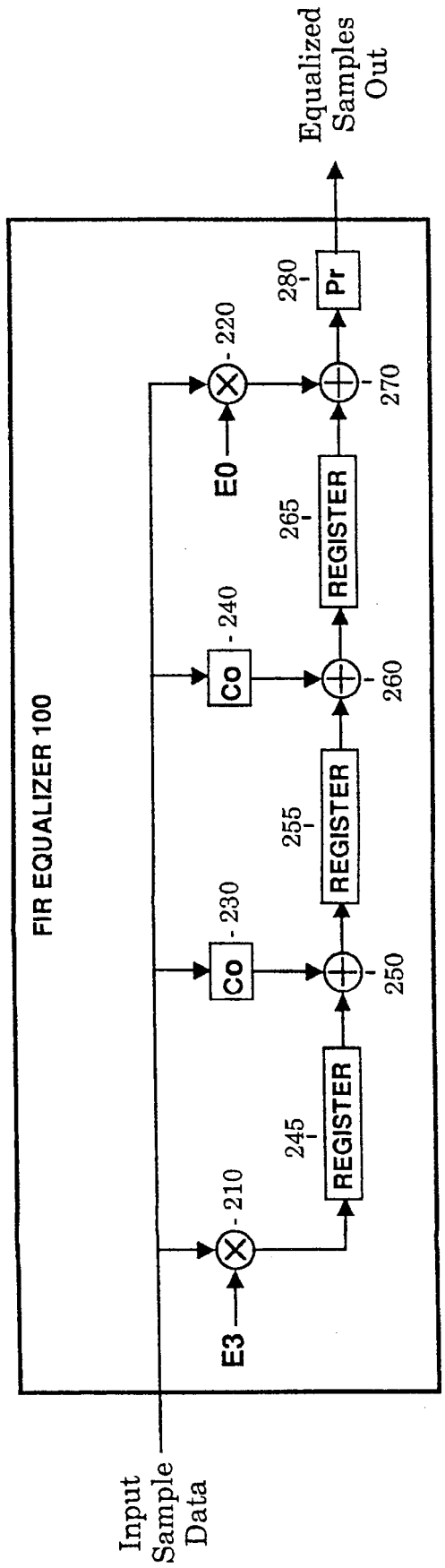
FIG. 2 illustrates a finite impulse response (FIR) equalizer configured in accordance with one embodiment of the present invention.

FIG. 2 illustrates the finite impulse response (FIR) equalizer 100 configured in accordance with one embodiment of the present invention. The FIR equalizer 100 receives input samples from the analog chip interface 105, and generates equalized sampled outputs. The FIR equalizer 100 contains a plurality of registers 245, 255 and 265 for storing and clocking intermediate data. The FIR equalizer 100 also contains conventional sign/magnitude multipliers 210 and 220 for generating outputs truncated to the precision of the tap coefficients. After performing the multiplication function, the sign magnitude multipliers 220 and 210 convert the multiplied data to 2's complement numbers.

The FIR equalizer 100 also contains the $C_o$ elements 230 and 240. The $C_o$ elements 230 and 240 are conventional sign/magnitude to 2's complement converters for the E1 and E2 coefficients of the FIR filter. The $C_o$ elements 230 and 240 are used in lieu of multipliers required for the E0 and E3 coefficients since they are fixed taps of weight $2^n$ (n is the selected precision). The FIR equalizer 100 contains the precision reducer (Pr) element 280. The Pr element 280 is a conventional precision reducer/amplitude limiter. The adder elements 250, 260 and 270 shown in FIG. 2 are conventional 2's complement adders. Each element in the FIR equalizer 100 may be pipelined and skewed in time. If pipelining is required, additional delay elements may be inserted so that the function of the algorithm is preserved.

The sampled data into the FIR equalizer 100 is formatted in a sign/magnitude notation with 5 bits of precision defining the magnitude. An input sample having a sign bit equal to 1 signifies a negative number. The peak output of the analog chip interface 105 varies due to a combination of noise, automatic gain control (AGC) precision, calibration precision and data pattern resolution. This variation is not completely corrected by the analog equalizer, and therefore the 5 bit magnitude precision of the input samples is only fully used when the samples are near the largest peak amplitudes encountered in the system. If peaks exceed the maximum range of the 5 bit magnitude precision (an infrequent occurrence), they must be clipped (i.e. amplitude-limited).

The precision for the multiplication function performed in the FIR equalizer 100 is 6 bits for the magnitude (e.g. notation includes sign and magnitude). After normalization to the largest coefficient, E1 and E2, the signal magnitudes are always less than 64 and greater than −64. The output precision of the multipliers 210, 220, 230, and 240 equals precision of the respective coefficient (e.g. six bits for the magnitude). In multipliers 210, 220, 230 and 240, output precision reduction is accomplished by truncation. The truncation operation is equivalent to dividing the magnitude by 32 and rounding down the resulting quotient. The magnitude is divided by 32 rather than 64 because the magnitude precision of the input data samples is 5 bits.

The output of multipliers 230, 240, and 220 are input to adders 250, 260, and 270, respectively. The output of multiplier 210 is input to register 245. The operation of the adders 250, 260, and 270 in conjunction with the registers 245, 255 and 265 perform an add/accumulate function for the FIR equalizer 100. The adders 250, 260, and 270 are all conventional 2's complement 8 bit adders which are well known in the art and will not be described further. Similarly, the multipliers 210 and 220 and registers 245, 255, and 265 are well known in the art and will not be described further.

The output of the add/accumulate function is input to the Pr element 280. The Pr element 280 performs a precision limit function for the output of the FIR equalizer 100. The FIR equalizer 100 output is formatted in 2's complement notation. The output precision of the FIR equalizer 100 is limited to the input precision of the Viterbi detector 110. Specifically, the output precision of the FIR equalizer 100 is 5 bits including the sign bit. The peak amplitude is clipped (amplitude-limited) as necessary not to exceed 5 bits. Occasional clipping of output peaks is expected.

The FIR equalizer 100 add/accumulate precision is dictated by the maximum magnitude of the accumulated values at each point in the computational sequence. In general, the maximum intermediate accumulated values are slightly greater than the maximum output accumulated values. Therefore, an additional bit above the maximum output amplitude is required (e.g. 8 bit precision for 2's complement).

The reduction of precision for output to the Viterbi detector 110 is achieved by truncation followed by correction of rounding for negative numbers. In order to perform the truncation function, the two low order bits are discarded and the remaining bits are shifted downward by two bits (e.g. toward the least significant bit). The rounding correction function is accomplished by adding one to negative numbers that contain at least one bit in either of the discarded least significant bit positions.

In order to ensure optimal use of decoder and equalizer precision, the Pr element 280 performs an amplitude control function at the FIR equalizer 100 output. The Pr element 280 contains a conventional counter, wherein the counter is utilized to log the count of instances when peak clipping was invoked. The counter is cleared at the start of each sector. In addition, when requested by the system microprocessor 120, the contents of the counter are transferred to the system microprocessor 120 at the end of a sector.

The input samples and equalizer coefficients for the FIR equalizer 100 are both formatted in sign/magnitude notation. Therefore, multiplication in the FIR equalizer 100 is executed using only positive numbers. The output sign bit from a multiplication is the exclusive OR (XOR) of input sign bits. In one embodiment, the multiplication function includes shift and add functions. The number of additions for implementing the multiplication is a function of the size of either the data precision or coefficient precision. Specifically, number of additions is defined by the relationship:

$N = P - 1$, wherein N is equal to the number of add elements, and P is equal to the larger of the input sample data precision or tap coefficient precision. Table 1 illustrates the coefficient precision required for each tap for the four tap equalizer embodiment of the present invention.

TABLE 1

| Tap | $E_n$ | $E_1$ | $E_2$ | $E_3$ |
| --- | --- | --- | --- | --- |
| Precision | 6 bits | NA | NA | 6 bits |

An optimum FIR equalizer 100 of the present invention employs six taps. However, four taps may be utilized with only minimal degradation in performance. In addition, two of the four taps in the 4 tap equalizer implementation may be set to a constant $2^n$, n an integer, with only minimal performance loss. The reduction of taps in the FIR equalizer represents a dramatic reduction in logic gates and power consumption in the equalizer.

Figure 3:
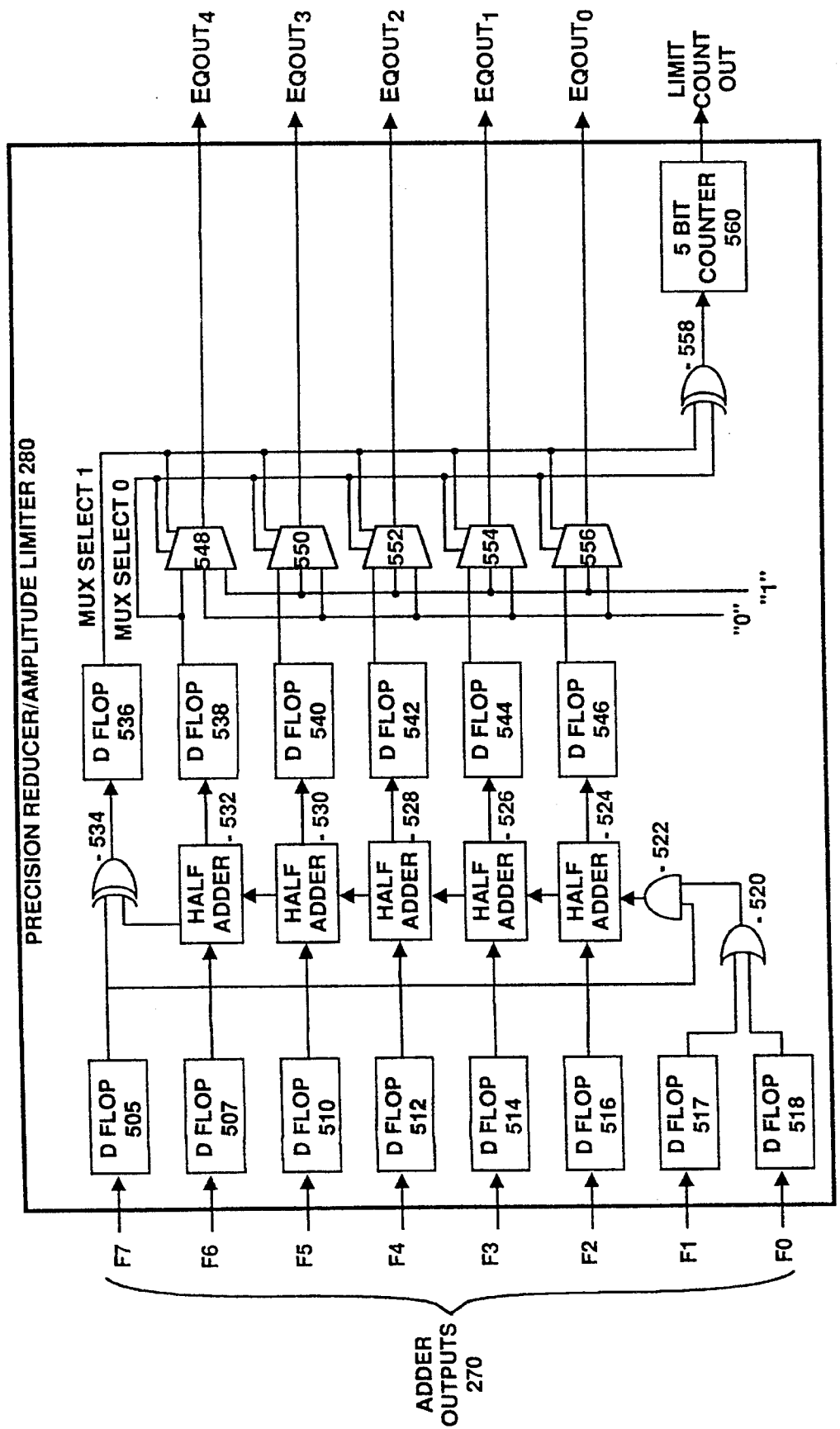
FIG. 3 illustrates a precision reducer/amplitude limiter (Pr) element.

FIG. 3 illustrates a precision reducer/amplitude limiter (Pr) element configured in accordance with one embodiment of the present invention. The Pr element 280 receives, as inputs, the adder 270 outputs F0–F7, and generates, as an output, a value $Eqout_0$–$Eqout_4$. The Pr element 280 contains a plurality of D type flip-flops 505, 507, 510, 512, 514, 516, 517, and 518 for receiving the $F_0$–$F_7$ value. For the embodiment illustrated in FIG. 3, the Pr element 280 first executes the precision reduction function. In order to implement the precision function, the Pr element 280 contains a plurality of half adders 524, 526, 528, 530, and 532, an XOR gate 534, and a plurality of D type flip-flops 536, 538, 540, 542, 544 and 546. The output of the XOR gate 534 and the half adders 524, 526, 528, 530, and 532 are input to the plurality of D type flip-flops 536, 538, 540, 542, 544 and 546, respectively.

For the embodiment shown in FIG. 3, the two low order input bits, $F_0$ and $F_1$, are discarded. The two low order bits, $F_0$ and $F_1$, are input to an OR gate 520, and the output of OR gate 520 is input to an AND gate 522 along with the sign bit, $F_7$. The output of the AND gate 522 is input to half adder 524. Therefore, if the $F_0$ –$F_7$ input value is negative, and either of the $F_0$ and $F_1$ bits are set to one, then the output is incremented by one so that the rounding function always rounds towards zero.

After executing the precision reduction function, the Pr element 280 performs an amplitude limitation operation. If the $F_0$–$F_7$ value is greater than 15 or less than −16, then the Pr element 280 outputs 15 or −16, respectively. In order to implement the amplitude limitation operation, the Pr element 280 contains a plurality of multiplexers (MUXs) 548, 550, 552, 554, and 556. The plurality of MUXs 548, 550, 552, 554, and 556 receive, as a first input, the outputs of the D type flip-flops 536, 538, 540, 542, 544 and 546, respectively. In addition, each of the plurality of MUXs receive a "0" and a "1" selector inputs, wherein the inputs represent a two bit number. The output of the plurality of MUXs are the $Eqout_0$–$Eqout_4$ outputs.

If the mux selects are equal to 00 or 11, then the top input to each MUX is selected. If the mux select is equal to 01, then the center input is selected, and if the mux select is equal to 10, then the bottom input is selected. For the amplitude limitation function, if the mux selects are equal to 01, then the value is positive and larger than 15. In this case, the MUXs select a value of 15 as the $Eqout_0$–$Eqout_4$ outputs. If the mux selects are equal to 10, then the value is negative and less than −16. In this case, the MUXs select a value of −16 as the $Eqout_0$–$Eqout_4$ outputs. If mux selects are either 00, or 11, then the value is known to be within the range of −16 to 15 and therefore the output $Eqout_0$–$Eqout_4$ is not limited. In addition to the plurality of MUXs, 548, 550, 552, 554, and 556, the mux selects are also input to the XOR gate 558 which produces an output pulse whenever the mux selects are either 01 or 10.

The Pr element 280 also contains a 5 bit counter 560 which receives the output signal from the XOR gate 558. The 5 bit counter 560 logs the number of times when the output $Eqout_0$–$Eqout_4$ amplitude was limited. If the count exceeds 31, then the counter stops at 31. At the request of the system microprocessor 120, the counter final value may be output via a serial port. The counter 560 output may be used to calculate an ideal automatic gain control (AGC) reference. The 5 bit counter 560 is automatically cleared at the start of each sector.

Figure 4:
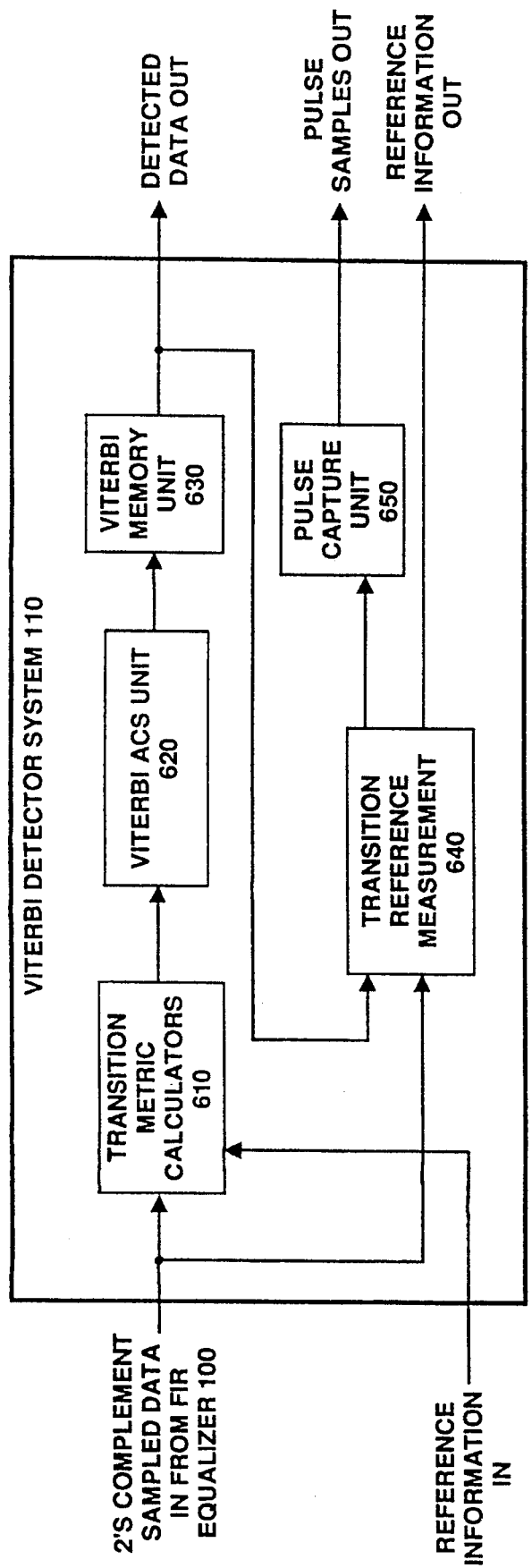
FIG. 4 illustrates a Viterbi detector system configured in accordance with one embodiment of the present invention.

THE VITERBI DETECTOR SYSTEM:

FIG. 4 illustrates a Viterbi detector system configured in accordance with one embodiment of the present invention. The Viterbi detector system 110 receives as inputs sampled data from the FIR equalizer 100 and references from the microprocessor 120. In response, the Viterbi detector system 110 generates, as outputs, detected data, pulse samples, and reference information. The Viterbi detector system 110 contains transition metric calculators 610, a Viterbi add/compare/select (ACS) unit 620, a Viterbi memory unit 630, a transition reference measurement unit 640, and a pulse capture unit 650.

The transition reference measurement unit 640 captures and accumulates data for calculating the most probable value of all references, $R_i$, by measuring a summation of data sample values, $D_i$, for selected legal bit sequences over a significant amount of random data. The summation and count of data samples are output to the microprocessor 120. The sampled data from the FIR equalizer 100 is input to the transition metric calculators 610. The transition metric calculators 610 calculate, in real time, magnitudes of the differences between the output data received from the FIR equalizer 100 and transition references for each data sample to generate transition metrics. For each state in the Viterbi trellis, there is one such calculation for each path in the Viterbi trellis. The Viterbi ACS unit 620 adds transition metrics to state metrics from the source nodes of two paths which lead into the state, and compares the result. The lesser of the two results yields the most likely correct new state metric. The Viterbi memory unit 630 stores bit strings that are updated and saved for each state. It also outputs data bits from an arbitrary bit string.

The present invention abandons the classical reference levels used in traditional Viterbi detection system in favor of "tuned" reference levels. In one embodiment, sixteen individually tuned references are utilized, one reference level for each of the sixteen valid paths in the Viterbi trellis. In general, reference tuning is accomplished by accumulating data samples, $D_i$, each time that a specific 5 bit sequence appears in real data, then averaging the accumulation over the number of instances that were encountered. The averages generated represent the means or most likely values expected for each of the 5 bit sequences.

The "tuned" reference levels of the present invention result in a net benefit beyond performance gain in a traditional Viterbi detector. Consequently, the equalization system of the present invention is less sensitive than an equalization system coupled to a Viterbi detector that is not tuned. Although the system of the present invention requires additional transition metric calculations, the reduction in logic gates and power in the FIR is enough to offset the additional transition metric calculations.

The Viterbi detector system 110 recognizes sixteen valid five bit data sequences, or paths, that satisfy the 1,7 encoding rules (e.g. data sequences that include at least one "0" bit between "1" bits). A 1,0 notation rather than a +,−notation is utilized to describe the sequence of write current polarities associated with each bit cell. When implementing such a notation, the sixteen valid paths are: 0,0,0,0,0=$P_0$; 00001= $P_1$; 00011=$P_3$; 00110=$P_6$; 000111=$P_7$; 01100=$P_{12}$; 01110= $P_{14}$; 011111=$P_{15}$; 10000=$P_{16}$; 10001=$P_{17}$; 10011=$P_{19}$ ; 11000=$P_{24}$; 11001=$P_{25}$; 11100=$P_{28}$; 11110=$P_{30}$; and 11111= $P_{31}$ associated with each of the 16 transition metrics.

Figure 5:
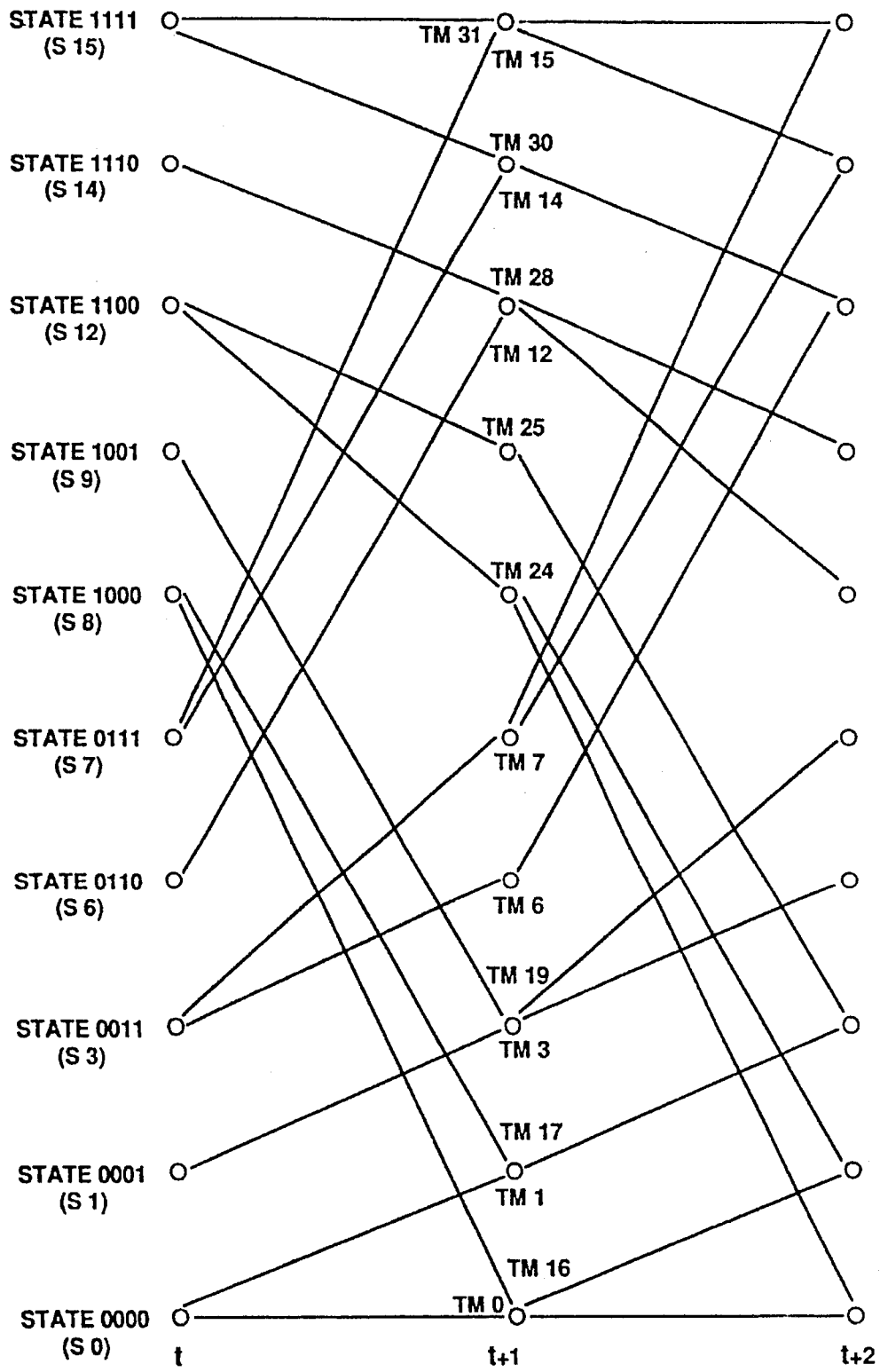
FIG. 5 illustrates a Viterbi trellis configured in accordance with one embodiment of the Viterbi system of the present invention.

FIG. 5 illustrates a trellis configured in accordance with one embodiment of the Viterbi system of the present invention. For the 1,7 recording code, FIG. 5 illustrates a ten state Viterbi trellis. Each row of nodes, as time progresses, is by definition all the same state. For example, the top row of nodes are all state 15, even though only the left most node is labeled. The subscript designations all have a particular meaning. The binary notation is changed into integer notation, wherein the binary notation reflects the most recent sequence of bits up to and including current time. However, the binary notation also represents that "ones" equal positive write current and "zeroes" equal negative write current. Polarity designation is necessary because the Viterbi detector system is polarity sensitive.

Figure 6:
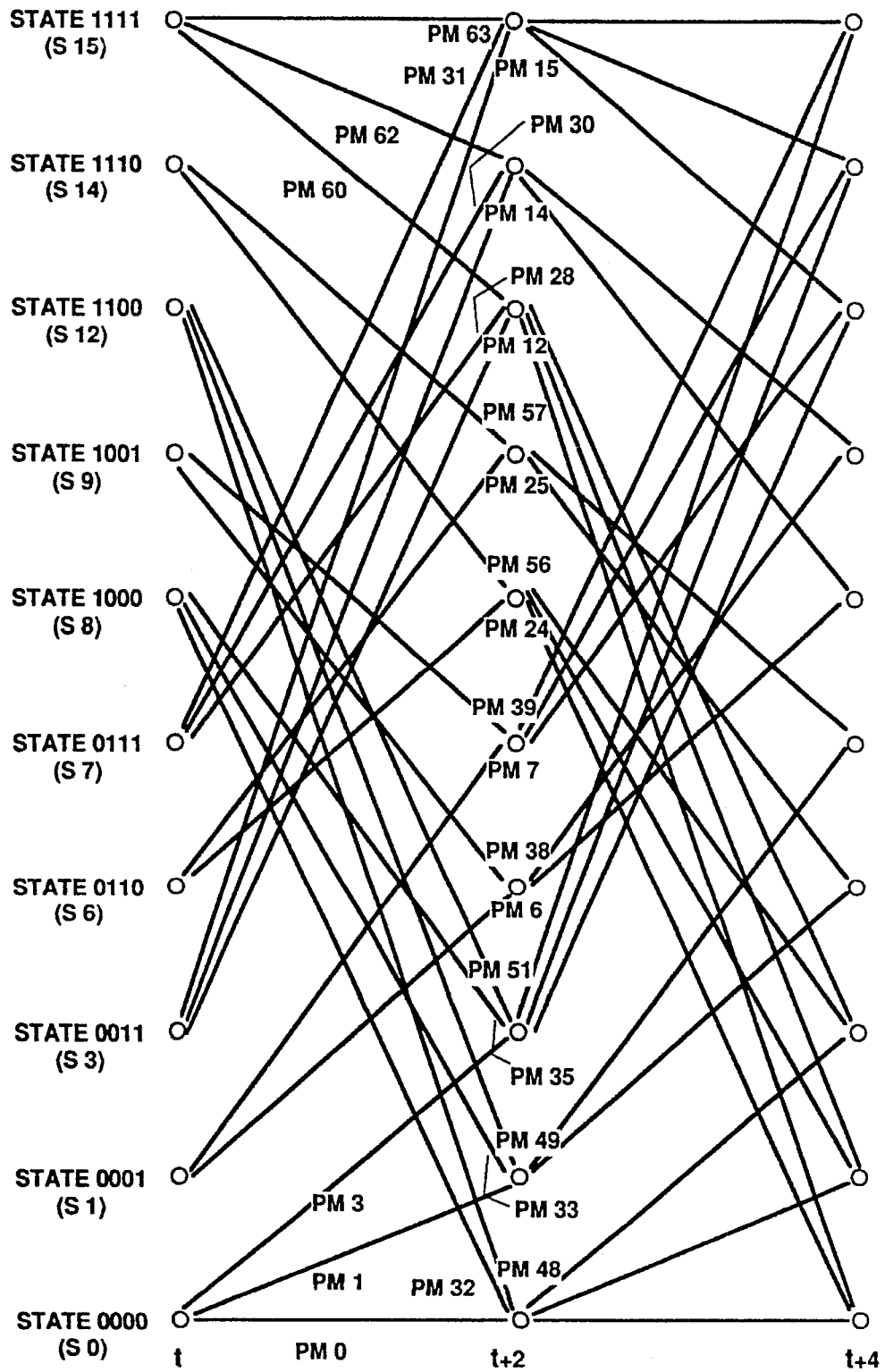
FIG. 6 illustrates a trellis configured in accordance with a second embodiment of the Viterbi system of the present invention.

As time progresses to time=t+1, a fifth bit, either "zero" or "one", could theoretically be added to each of the ten four bit sequences creating twenty states from the ten states, but only sixteen such combinations are valid within the 1,7 recording code rules. However, complexity limitations of the system dictate that the number of states does not increase. Instead, a decision is made as to which of two (or one, in some cases) of the valid five bit sequences is the most likely to have occurred in arriving at each state for time=t+1. The valid five bit sequences, sixteen in number, are frequently called "paths". The metric computed for the least FIG. 6 illustrates a trellis configured in accordance with a second embodiment of the Viterbi system of the present invention. The trellis disclosed in FIG. 6 is entitled a collapsed trellis because two time slots are collapsed into a single time slot. Note that path metrics $PM_i$ are shown rather than transition metrics because the path metrics become potential new state metrics. For the trellis illustrated in FIG. 6, two transition metrics, one for each time interval, are added to old state metrics to create potential new state metrics. Table 2 shows path metrics and required additions in the same order as shown in the trellis diagram. Transition metric designations and subscript designations are identical to those in described in conjunction with the trellis illustrated in FIG. 5.

TABLE 2

| New State Metric (time = t + 2) | Path Metric = (time = t + 2) | Old State Metric (Source) (time = t) | Plus Transition Metric (time = t + 1) | Plus Transition Metric (time = t + 2) |
|---|---|---|---|---|
| SM 15 = lessor of | PM 63= | SM 15 | +TM 31 | +TM 31 |
| or | PM 31= | SM 7 | +TM 15 | +TM 31 |
| or | PM 15= | SM 3 | +Tm 7 | +TM 15 |
| SM 14 = lessor of | PM 62= | SM 15 | +TM 31 | +TM 30 |
| or | PM 30= | SM 7 | +TM 15 | +TM 30 |
| or | PM 14= | SM 3 | +TM 7 | +TM 14 |
| SM 12 = lessor of | PM 60= | SM 15 | +TM 30 | +TM 28 |
| or | PM 28= | SM 7 | +TM 14 | +TM 28 |
| or | PM 12= | SM 3 | +TM 6 | +TM 12 |
| SM 9 = lessor of | PM 57= | SM 14 | +TM 28 | +TM 25 |
| or | PM 25= | SM 6 | +TM 12 | +TM 25 |
| SM 8 = lessor of | PM 56= | SM 14 | +TM 28 | +TM 24 |
| or | PM 24= | SM 6 | +TM 12 | +TM 24 |
| SM 7 = lessor of | PM 39= | SM 9 | +TM 19 | +TM 7 |
| or | PM 7= | SM 1 | +TM 3 | +TM 7 |
| SM 6 = lessor of | PM 38= | SM 9 | +TM 19 | +TM 6 |
| or | PM 6= | SM 1 | +TM 3 | +TM 6 |
| SM 3 = lessor of | PM 51= | SM 12 | +TM 25 | +TM 19 |
| or | PM 35= | SM 8 | +TM 17 | +TM 3 |
| or | PM 3= | SM 0 | +TM 1 | +TM 3 |
| SM 1 = lessor of | PM 49= | SM 12 | +TM 24 | +TM 17 |
| or | PM 33= | SM 8 | +TM 16 | +TM 1 |
| or | PM 1= | SM 0 | +TM 0 | +TM 1 |
| SM 0 = lessor of | PM 48= | MS 12 | +TM 24 | +TM 16 |
| or | PM 32= | SM 8 | +TM 16 | +TM 0 |
| or | PM 0= | SM 0 | +TM 0 | +TM 0 | likely sequence (or path) is then discarded in favor of the metric computed for the most likely sequence. The new state metric assumes the most likely value. This selection process reduces the 16 possible states back to the original ten states.

The 1,7 code eliminates six of the sixteen possible nodes and sixteen of the thirty two possible paths that would otherwise exist. The deleted nodes and paths are illegal under the 1,7 coding rules. All sixteen remaining legal paths each require a fast adder for adding the transition metrics to the old state metrics to calculate new state metrics. In addition, for each of the six state nodes that has two paths leading into the node, a fast comparator and multiplexer are utilized so that only one of the two computed sums becomes the new metric. A full add/compare/select element is required for the six nodes receiving two paths, whereas only the add element is required for the remaining four nodes receiving one path. For single path nodes, selection is predetermined by 1,7 coding rules so that the compare and select functions in the Viterbi ACS 620 are eliminated. The entire add/compare/select function is executed within a single bit cell time. Alternatively, a more complex trellis is possible which permits a larger set of computations to be completed within two or more cell times.

Note also that either two or three potential new state metrics are created for each state. This requires two or three way decisions in lieu of one or two way decisions as in the previous trellis illustrated in FIG. 5. The block diagram of the total ACS unit is not shown because Table 2 fully describes the algorithm.

Figure 7:
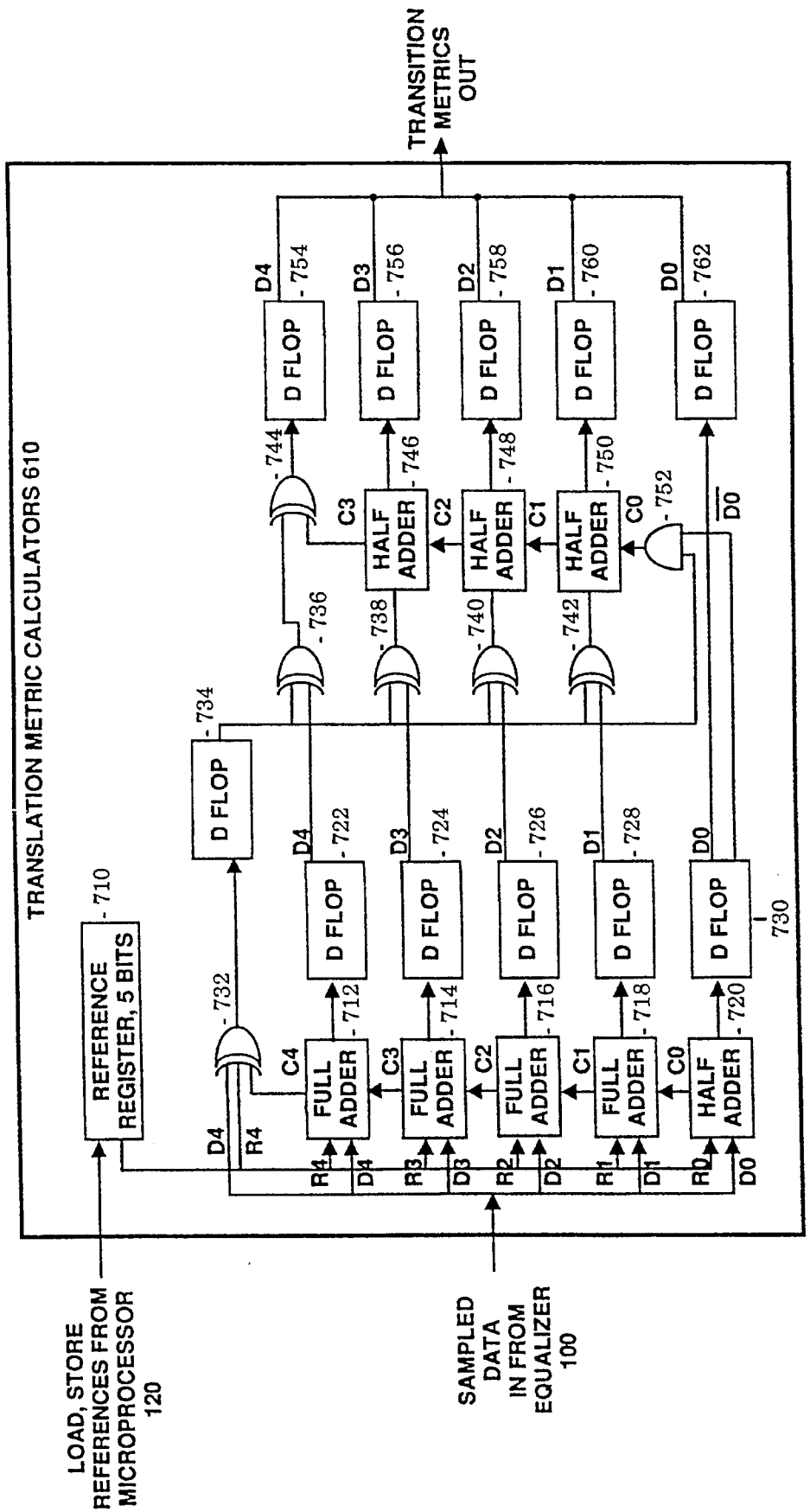
FIG. 7 illustrates one embodiment of the transition metric calculators.

FIG. 7 illustrates transition metric calculators configured in accordance with one embodiment of the present invention. For the system of the present invention, 16 transition metric calculators are required. Translation metric calculators 610 contain a reference register 710 for storing a corresponding transition reference. The transition reference (R0-R4) and input data (D0-D4) are input to a plurality of full adders (712, 714, 716, and 718) and a half adder 720. The sign bit is input to an exclusive OR gate 732. The output of the adders are input to a plurality of D-flip flops (722, 724, 726, 728 and 730), and the output of the XOR gate 732 is input to a D type flip-flop 734. The translation metric calculators 610 perform a complement add one operation, for negative numbers, utilizing a plurality of exclusive OR gates (736, 738, 740, 742, and 744), a plurality of half adders (746, 748, and 750), and an AND gate 752. The output result is latched in a plurality of D flip flops (754, 756, 758, 760, and 762).

In general, the transition metric calculators 610 calculate, in real time, magnitudes of the differences between the output data received from the FIR equalizer 100 and transition references for each data sample. The transition metric calculators 610 may be pipelined so that simple ripple adders may be utilized. In one embodiment, both the transition references and the input sample data are nominally 5 bit precision (including the sign bit). The output transition metrics are 5 bit magnitude precision. The output transition metrics are always positive thereby eliminating the need for a sign bit. The input data samples and the transition references may be either positive or negative. The transition metric calculators 610 execute a function in accordance with the following relationship:

$TM_{i,t}=|D_t-R_i|$, where $TM_{i,t}$ is transition metric $i$ at time $t$, $D_t$ is data sample at time $t$, and $R_i$ is transition reference $i$.

During each bit cell time, the transition metric calculators 610 calculate 16 transition metrics. Consequently, during each bit cell time, 16 new transition metrics are output from the transition metric calculators 610. The sign of the input data sample is utilized in the calculation. However, negative calculation results are subsequently converted into positive transition metrics using sign converters (complement and add 1).

In order to perform the conversion from negative to positive numbers, the transition metric calculators 610 execute complement and add one operations. The positive input sample data passes through the transition metric calculators 610 unaltered. In an alternative embodiment, in order to reduce power consumption, the add one function may be eliminated from all 16 transition metric calculations with minimal loss in performance.

In general, the transition reference measurement unit 640 measures the most probable value of all references, $R_i$. The transition reference measurement unit 640 measures a summation of data sample values, $D_t$, over a significant amount of random data. The $D_t$ are summed when they coincide with the times that path $P_i$ exists because $P_i$ is directly associated with $R_i$. The path is a specific sequence of five consecutive encoded bits.

In addition, a count of instances that path $P_i$ is encountered is required to compute an average. Both the summation of data sample values and count of instances that induce the summation are output to the local microcomputer 120 for calculating an average reference level value. The transition reference measurement 640 operates in accordance with the following equation:

$$R_i = \frac{\sum_t D_t}{\sum_t 1},$$

for all t in which path Pi is encountered, t is in cell units

In one embodiment of the present invention, only one transition metric measurement unit is required to collect summations and counts for all 16 references by rerunning the same random data through the transition metric measurement unit 16 times, once for each of the 16 legal 5 bit sequences. Each set generates a reference for a different valid path. In one embodiment, summations are collected one sector at a time, and consequently, the counters and accumulators are sized accordingly. At least one set of $R_i$ per magnetic head is desired. Additional sets of $R_i$ per head may be utilized depending on the amount of variation encountered over the range of recording zones and areas within each zone.

The Viterbi add/compare/select (ACS) unit 620 receives, as an input, the transition metrics output from the transition metric calculators 610. The Viterbi ACS unit 620 is a primary functional unit within the Viterbi detector system 110. The main purpose of the Viterbi ACS 620 is to identify the most probable correct paths, to enter the corresponding state, and to subsequently update the state metrics, $SM_j$ and state bit strings, $BS_j$, accordingly. In order to accomplish this task, the Viterbi ACS 620 adds pairs of the computed transition metrics to pairs of old state metrics, and compares the sums for each pair to determine the lesser of the two sums. The Viterbi ACS 620 selects the lesser of the two sums as the surviving state metric. In addition, the Viterbi ACS unit 620 forwards the compare decisions to the Viterbi memory unit 630 so that bit strings, associated with each state, are updated.

The Viterbi ACS unit 620 operates in accordance with the following relationship:

$SM_{j,t+1}$=the lesser of $SM_{k,t}+TM_{m,t+1}$ or $SM_{l,t}+TM_{n,t+1}$, wherein, the subscripts k and l refer to the specific state nodes that lead to paths into state j, and subscripts m and n refer to the specific paths that lead into state j, and t refers to time in cell units.

Figure 8:
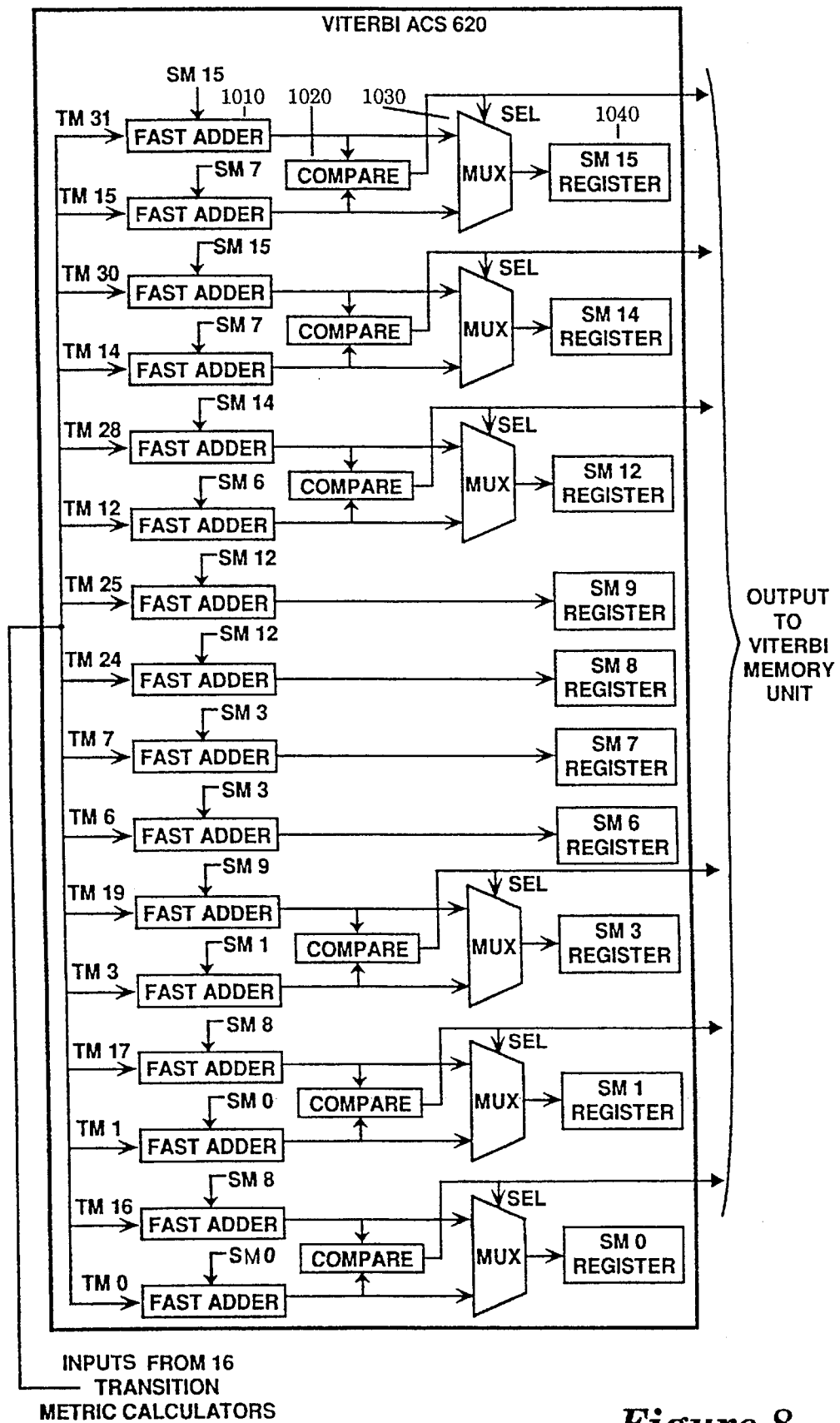
FIG. 8 illustrates the Viterbi add/compare/select (ACS) unit configured in accordance with one embodiment of the present invention.

FIG. 8 illustrates the Viterbi ACS unit 620 configured in accordance with one embodiment of the present invention. In one embodiment, the Viterbi ACS unit 620 contains a plurality of fast adders, such as fast adder 1010, a plurality of compare units, such as compare unit 1020, a plurality of selection multiplexers (MUXs), such as selection MUX 1030, and a plurality of state metric registers for each state metric, such as state metric register 1040. The Viterbi ACS unit 620 receives, as inputs, sixteen transition metrics from the transition metric calculators 610. In turn, the Viterbi ACS unit 620 updates the state metric as appropriate. For clarity, the state metric source inputs to the fast adders are designated by the corresponding state metric number rather than illustrating input lines from the respective state metric registers.

The input path widths from the transition metric calculators 610 are all 5 bits, unsigned positive. The state metric register accumulators are all 8 bits. The state metric registers store unsigned (positive) values. The input to the fast adders are 5 bits for the transition metrics and 8 bits for the state metrics. The output of the fast adders are also 8 bits, and consequently, all compare operations are 8 bits. Each selection MUX has two 8 bit inputs and one 8 bit output. The output of a corresponding compare unit is the selection input to the MUX and also to the Viterbi memory unit. As stated above, the lesser of the two sums identifies both the sum that becomes the new state metric and the path selected in arriving at that state (which implies an impact to the memory unit).

When the compare unit selects a path from old state "j", then the bit string from "j" is utilized as the new bit string associated with the new state metric. The bit string is shifted to accommodate a new bit each cell time. The value of each new bit is a function of the particular source node, and the associated source node bit string, that was selected. The bit string notation uses identical subscript as the associated source node state metric. For all bit strings that originated from source nodes $S_6$, $S_7$, $S_8$, and $S_9$, a new 1 bit is entered. For all bit strings that originated from all other source nodes, a new 0 bit is entered. This is true for all nodes.

State metric overflow protection comprises an AND tree (not shown) collecting high order bit inputs from all state metric registers. When all high order bits are one, then all high order bits are set to zero. Mathematically, the operation is defined by: if $SM_i$ is greater than or equal to 128 for all i, then $SM_i$ equals $SM_i -128$ for all i. This operation is performed between completion of the comparison of high order bits and the beginning of the next addition for high order bits.

The compare function 1020 in the Viterbi ACS 620 can be executed mostly in parallel with the fast adder function. The compare function is mathematically and logically the equivalent of computing the borrow bit for a subtract operation.

The fast adder function is a conventional carry look ahead adder and can be partially implemented in parallel logic.

Figure 9:
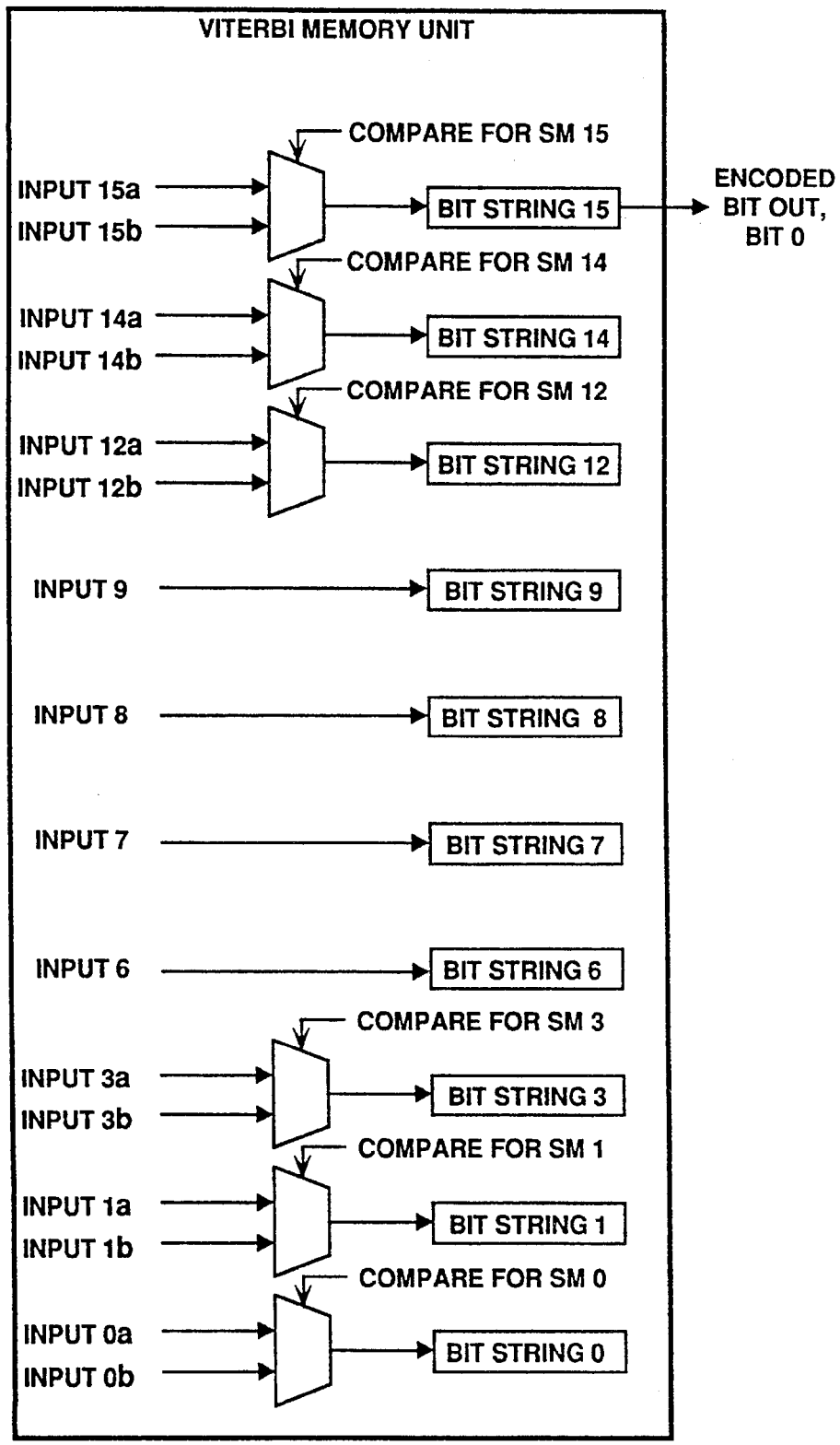
FIG. 9 illustrates one embodiment of a Viterbi memory unit.

FIG. 9 illustrates the Viterbi memory unit 630 configured in accordance with one embodiment of the present invention. In addition to updating and saving the state metrics in the state metrics registers, the Viterbi detector system updates bit strings for each state using the Viterbi memory unit 630. In general, three types of update are executed: insertion of the correct new bit at the head of each bit string (bit 14); total replacement of strings as dictated by the compare operations and other "no decision" replacements as dictated by the trellis; and output of the oldest encoded bit (old bit 0) from an arbitrary bit string. As noted above, if the surviving source node is $S_6$, $S_7$, $S_8$ or $S_9$, then a 1 bit is inserted in the front end of the string. Otherwise, a 0 bit is inserted. The remainder of bits in the string are replaced from the bit string associated with the source node (which depends on the path decision). Table 3 lists the 16 bit string inputs for the ten state trellis and memory unit.

particular block is unrecoverable using other more conventional recovery procedures. The transition reference measurement unit 640 contains a five bit path register 810, a five bit encoded bit string register 805, a five bit compare unit 807, a ten bit counter 820 coupled to the five bit compare unit 807, a sample delay unit 840, a gate 830, and a fifteen bit adder/accumulator 850.

The five bit path register 810 is preloaded with a sequence, in binary notation identical to the input encoded bit string. The five bit compare unit 807 compares the path number stored in the five bit path register 810 with the encoded bit string as it progresses through the five bit shift register 805. Whenever a match occurs between the five bit encoded bit string and the stored five bit legal sequence (associated with a trellis path), two events occur: the 10 bit counter 820 is incremented by 1, and the gate 830 is temporarily opened to add the sum resident in the fifteen bit adder/accumulator 850 to the input data sample. When a particular sector is completed, the contents of both the fifteen bit adder/accumulator 850 and the ten bit counter 820 can be transferred to the local microprocessor 120, via a serial port, for calculation of the average reference. Each reference is then stored for future use by the transition metric calculators 610. In one embodiment, a complete set of 16 references is loaded into the transition metric calculators 610 each time the appropriate head is selected and appropriate zone or sub-zone is accessed.

The transition metric measurement unit 640 also contains a sample delay unit 840. The sample delay 840 delays the input sample data to precisely match the delay through the transition metric calculators 610, the Viterbi ACS unit 620 and the Viterbi memory unit 630.

As shown in FIG. 4, the Viterbi detector system 110 contains the pulse capture unit 650. The pulse capture unit

TABLE 3

| | |
|---|---|
| INPUT 15a | BIT 14 = 0, BITS 0 – 13 FROM OLD BS 15, BITS 1 – 14 respectively |
| INPUT 15b | BIT 14 = 1, BITS 0 – 13 FROM OLD BS 7, BITS 1 – 14 respectively |
| INPUT 14a | BIT 14 = 0, BITS 0 – 13 FROM OLD BS 15, BITS 1 – 14 respectively |
| INPUT 14b | BIT 14 = 1, BITS 0 – 13 FROM OLD BS 7, BITS 1 – 14 respectively |
| INPUT 12a | BIT 14 = 0, BITS 0 – 13 FROM OLD BS 14, BITS 1 – 14 respectively |
| INPUT 12b | BIT 14 = 1, BITS 0 – 13 FROM OLD BS 6, BITS 1 – 14 resg)ectively |
| INPUT 9 | BIT 14 = 0, BITS 0 – 13 FROM OLD BS 12, BITS 1 – 14 respectively |
| INPUT 8 | BIT 14 = 0, BITS 0 – 13 FROM OLD BS 12, BITS 1 – 14 respectively |
| INPUT 7 | BIT 14 = 0, BITS 0 – 13 FROM OLD BS 3, BITS 1 – 14 rest)ectively |
| INPUT 6 | BIT 14 = 0, BITS 0 – 13 FROM OLD BS 3, BITS 1 – 14 reseectively |
| INPUT 3a | BIT 14 = 1, BITS 0 – 13 FROM OLD BS 9, BITS 1 – 14 respectively |
| INPUT 3b | BIT 14 = 0, BITS 0 – 13 FROM OLD BS 1, BITS 1 – 14 respectlvelv |
| INPUT 1a | BIT 14 = 1, BITS 0 – 13 FROM OLD BS 8, BITS 1 – 14 respectively |
| INPUT 1b | BIT 14 = 0, BITS 0 – 13 FROM OLD BS 0, BITS 1 – 14 respectiveiv |
| INPUT 0a | BIT 14 = 1, BITS 0 – 13 FROM OLD BS 8, BITS 1 – 14 respectively |
| INPUT 0b | BIT 14 = 0, BITS 0 – 13 FROM OLD BS 0, BITS 1 – 14 respectively |

Each bit string shown in FIG. 9 is 15 bits in length. The encoded bit out is arbitrarily extracted from old bit 0 of bit string 15 but any bit string could be used. Other old bits 0 are discarded.

Figure 10:
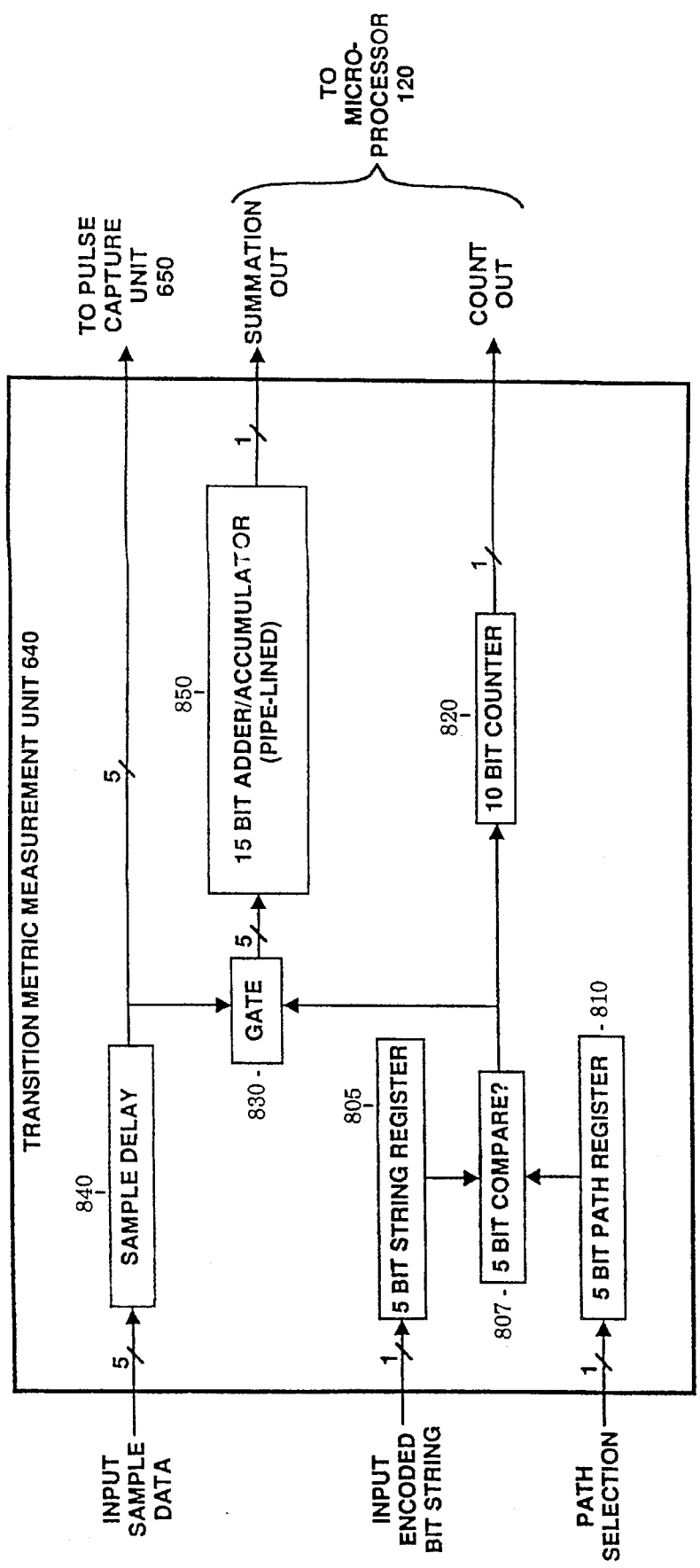
FIG. 10 illustrates a transition metric measurement unit configured in accordance with one embodiment of the present invention.

FIG. 10 illustrates the transition reference measurement unit 640 configured in accordance with one embodiment of the present invention. The input sample data is synchronized with the input encoded bit string using an appropriate amount of sample delay in 840. The encoded bit string and path selector inputs are both formatted in a non return to zero (NRZ) notation like that used in the trellis description. The encoded bit string is output from the Viterbi memory unit 630, and converted to the correct notation. The input encoded bit string permits re-tuning on real data as it arrives. In particular, the input encoded bit string may also permit re-tuning and error recovery on a specific block if that 650 is utilized to capture a set of samples spanning the critical area of an isolated pulse. For these samples, the microprocessor can calculate equalizer tap coefficients on a head by head, zone by zone and, if necessary, sub-zone by sub-zone basis. The pulse capture unit 650 utilizes samples stored within the transition reference measurement unit 640 and perhaps the FIR equalizer 100. In general, the function of the pulse capture unit 650 includes control and gating of samples to the serial port for transmission to the local microprocessor 120.

Tuned Viterbi systems may also be usefully applied to forms of data storage other than magnetic or to data transmission systems if either exhibit significant amounts of non-linear ISI.

Although the present invention has been described in terms of specific exemplary embodiments, it will be appreciated that various modifications and alterations might be made by those skilled in the art without departing from the spirit and scope of the invention as set forth in the following claims. Modifications may be in many forms including but not limited to partial response pulse shapes, Viterbi complexity, precision of all elements within the system, methods for extracting reference tuning information, FIR equalizer complexity and precision, length of memory unit bit strings, etc.

What is claimed is:

1. A method for use in detecting an input data stream via a Viterbi system, said method comprising the steps of:

providing a Viterbi detector capable of receiving input data samples and converting said input data samples into a digital output signal indicative of data stored on a recording medium or transmitted over a communication channel, said Viterbi detector comprising a trellis structure including:

a plurality of nodes arranged in a plurality of rows and columns, each row associated with a distinct state of said Viterbi detector and each column associated with a distinct level of said Viterbi detector;

a plurality of state metrics, each state metric associated with one of said distinct states of said Viterbi detector; and a plurality of paths between nodes in adjacent levels in said Viterbi detector, each path having a corresponding transition reference value;

tuning a transition reference value associated with a first path of said trellis structure by changing said transition reference value from a first value to a second value, said first path beginning at a state in a first level and terminating at a state in a second level;

calculating a transition metric for said first path using said second value of said transition reference value and at least one of said input data samples;

combining said transition metric corresponding to said first path with a state metric corresponding to said beginning state in said first level to update said state metric associated with said terminating state in said second level; and choosing a most likely path through said trellis structure using said updated state metric, said most likely path being representative of said digital output signal;

wherein said step of tuning improves the error rate performance of said Viterbi detector.

2. The method as set forth in claim 1, wherein said step of tuning includes tuning a separate transition reference value for each of a group of more than one and less than all of said paths in said plurality of paths in said trellis structure wherein said other paths in said plurality of paths remain untuned.

3. The method as set forth in claim 1, wherein said step of tuning includes tuning a separate transition reference value for each path in said trellis structure.

4. The method as set forth in claim 1, wherein said Viterbi detector comprises a ten state trellis and sixteen transition metrics based on a 1,7 recording code.

5. The method as set forth in claim 1, wherein said Viterbi detector comprises a collapsed trellis based on a 1,7 recording code.

6. The method as set forth in claim 1, wherein said step of providing includes providing a Viterbi detector having an equal number of paths and transition reference values, each path corresponding to a separate transition reference value.

7. An apparatus for use in detecting an input data stream via a Viterbi system, said apparatus comprising:

a Viterbi detector capable of receiving input data samples and converting said input data samples into a digital output signal indicative of data stored on a recording medium or transmitted over a communication channel, said Viterbi detector comprising a trellis structure including:

means for receiving said input data samples;

a plurality of nodes arranged in a plurality of rows and columns, each row associated with a distinct state of said Viterbi detector and each column associated with a distinct level of said Viterbi detector;

a plurality of state metrics, each state metric associated with one of said distinct states of said Viterbi detector; and a plurality of paths between nodes in adjacent levels in said Viterbi detector and an equal number of transition reference values, each path corresponding to a separate transition reference value;

means for tuning a transition reference value associated with a first path of said trellis structure by changing said transition reference value from a first value to a second value; and means for calculating a transition metric for said first path using said tuned transition reference value and at least one of said input data samples;

wherein said Viterbi detector performs said conversion by choosing a most likely path through said trellis structure using said state metrics and said transistor metric associated with said first path.

8. The apparatus as set forth in claim 7, wherein said Viterbi detector comprises:

a Viterbi add/compare/select (ACS) unit coupled to said means for calculating for storing a state metric for each state in said Viterbi system, and for selecting, for each state in said Viterbi system, a path based on corresponding state metrics and transition metrics; and a Viterbi memory unit for storing a plurality of bit strings corresponding to decoded bit strings for said input data, for updating said bit strings based on said paths selected, and for selecting one of said plurality of bit strings for said digital output signal.

9. The apparatus as set forth in claim 8, further comprising a plurality of comparators and a plurality of multiplexors for updating said state metrics by creating and storing new state metrics using said transition metrics associated with said selected paths.

10. The apparatus as set forth in claim 8, wherein said Viterbi ACS unit implements a ten state trellis and sixteen transition metrics based on a 1,7 recording code.

11. The apparatus as set forth in claim 7, wherein said Viterbi system, comprises a collapsed trellis based on a 1,7 recording code.

12. A magnetic drive system comprising:

a finite impulse response (FIR) equalizer for receiving input data and for equalizing said input data, said input data having a nonlinear intersymbol interference (ISI) component; and a Viterbi system, coupled to an output of said FIR equalizer, comprising:

a Viterbi detector capable of receiving equalized input data samples and converting said equalized input data samples into a digital output signal indicative of data stored on a magnetic medium or transmitted over a communication channel, said equalized input data samples representing non-ideal pulse shapes which are due, in part, to said nonlinear ISI, said Viterbi detector comprising a trellis structure including:
 a plurality of nodes arranged in a plurality of rows and columns, each row associated with a distinct state of said Viterbi detector and each column associated with a distinct level of said Viterbi detector;
 a plurality of state metrics, each state metric associated with one of said distinct states of said Viterbi detector; and
 a plurality of paths between nodes in adjacent levels in said Viterbi detector, each path having a corresponding transition reference value;
means for tuning a transition reference value associated with a first path of said trellis structure based on measurement of said non-ideal pulse shapes associated with said equalized input data samples; and
means for calculating a transition metric for said first path using said transition reference value and at least one of said input data samples;
 wherein said Viterbi detector performs said conversion by choosing a most likely path through said trellis structure using said state metrics and said transition metric associated with said first path;
 wherein said tunable Viterbi system permits said FIR equalizer to be of a type that is incapable of creating a substantially ideal pulse shape using said input data without producing a significant reduction in the error rate performance of said Viterbi detector.

13. The magnetic drive system as set forth in claim 12, wherein aid FIR equalizer comprises:
 a plurality of multipliers for multiplying said input data;
 a plurality of two's complement converters for converting input data;
 a plurality of registers coupled to said two's complement converters and said multipliers for storing and clocking data input from said two's complement converters and said multipliers;
 a plurality of adders coupled to said two's complement converters, said multiplier and said registers; and
 a precision reduction limiter coupled to an adder for limiting the precision of said input data from said FIR equalizer.

14. The magnetic drive system as set forth in claim 12, wherein said Viterbi detector comprises:
 a Viterbi add/compare/select (ACS) unit coupled to said means for calculating a transition metric for storing a state metric for each state in said Viterbi system, and for selecting, for each state in said Viterbi system, a path based on corresponding state metrics and transition metrics; and
 a Viterbi memory unit for storing a plurality of bit strings corresponding to decoded bit strings for said input data, for updating said bit strings based on said paths selected, and for selecting one of said plurality of bit strings for said digital output signal.

15. The magnetic drive system as set forth in claim 12, further comprising a plurality of comparators and a plurality of multiplexors for updating said state metrics by creating and storing new state metrics using said transition metrics associated with said selected paths.

16. The magnetic drive system as set forth in claim 12, wherein said Viterbi detector implements a ten state trellis and sixteen transition metrics based on a 1,7 recording code.

17. The magnetic drive system as set forth in claim 12, wherein said Viterbi detector comprises a collapsed trellis based on a 1,7 recording code.

18. The apparatus as set forth in claim 7, wherein:
 said means for tuning includes means for tuning separate transition reference values for every path in said trellis structure.

19. The apparatus as set forth in claim 7, wherein:
 said means for tuning includes means for calculating said second value of said transition reference value using said digital output signal and said input data samples.

20. The apparatus as set forth in claim 19, wherein:
 said means for calculating said second value includes means for collecting samples from said input data samples, said collected samples being associated with a predetermined sequence of data bits in said digital output signal.

21. The apparatus as set forth in claim 20, further comprising a magnetic disk drive coupled to said means for collecting samples for allowing the collection of a plurality of data samples from a portion of a magnetic medium in said magnetic disk drive.

22. The apparatus as set forth in claim 20, wherein:
 said means for collecting samples includes gating means for selecting a data sample from said input data samples whenever a detected bit string in said digital output signal is equivalent to a predetermined sequence of data bits.

23. The apparatus as set forth in claim 20, wherein:
 said means for calculating said second value further includes means for summing said samples collected from said input data samples.

24. The apparatus as set forth in claim 23, wherein:
 said means for calculating said second value further includes means for counting the number of samples collected from said input data samples.

25. The apparatus as set forth in claim 24, wherein:
 said means for calculating said second value further includes means for dividing a sum of said samples collected from said input data samples by said number of said samples.

26. The apparatus as set forth in claim 7, wherein:
 said means for calculating a transition metric includes means for finding a difference between said tuned transition reference value and a corresponding input data sample.

27. A Viterbi detection system using a Viterbi trellis structure having a plurality of states, each state having an associated state metric, a plurality of levels, and a plurality of separate paths between states in adjacent levels, each path having an associated transition reference, the trellis structure for use in detecting data in an input signal, said system comprising:
 means for tuning a transition reference associated with a first path in said trellis structure by changing said transition reference from a first value to a second value using data previously detected by said Viterbi detection system, said first path starting at a state in a first level and ending at a state in a second level;
 means for calculating a transition metric associated with said first path by arithmetically combining said input signal with said tuned transition reference associated with said first path; and
 an add-compare-select (ACS) unit corresponding to said state in said second level, said ACS unit including:
 means for adding said transition metric associated with said first path to a state metric associated with said state in said first level to produce a first sum;

means for comparing said first sum to sums associated with other paths ending at said state in said second level; and means for selecting a smallest sum from those compared as representing a possible most likely path through said trellis structure; and memory means for storing said smallest sum selected by said ACS unit as an updated state metric associated with said state in said second level;

wherein said means for tuning improves the error rate performance of said Viterbi system.

28. The detection system as set forth in claim 27, wherein:

said means for tuning includes means for tuning transition references associated with every path in said trellis structure.

29. The detection system as set forth in claim 27, wherein:

said means for calculating includes means for determining a difference between a sample of said input signal and said tuned transition reference associated with said first path.

30. The detection system as set forth in claim 27, wherein:

said means for tuning includes means for accumulating a plurality of samples of said input signal, wherein each of said samples in said plurality corresponds to said first path through said trellis structure.

31. The detection system as set forth in claim 30, wherein:

said means for tuning further includes means for finding a sum of said samples in said plurality of samples.

32. The detection system as set forth in claim 30, wherein:

said means for tuning further includes means for finding an average of said samples in said plurality of samples.

33. The method as set forth in claim 2, wherein the steps of combining and choosing further include:

receiving said plurality of tuned transition reference values;

storing a state metric for each state in said Viterbi detector;

selecting, for each state in said Viterbi detector, a path based on said corresponding state metrics and tuned transition reference values;

storing a plurality of bit strings corresponding to decoded bit strings for said input data samples;

updating said bit strings based on said paths selected in said step of selecting a path; and selecting one of said plurality of bit strings for said digital output signal.

34. The apparatus as set forth in claim 7, wherein:

said trellis structure includes three or more distinct states.

35. The apparatus as set forth in claim 7, wherein:

said means for tuning includes means for tuning transition reference values for more than one path in said plurality of paths.

36. The apparatus as set forth in claim 7, wherein:

said means for calculating further includes means for calculating transition metrics for paths in said trellis other than said first path.

37. The apparatus as set forth in claim 36, wherein:

said Viterbi detector further comprises means for adding state metrics to transition metrics for each path through said trellis structure and means for eliminating paths based on the results of said addition.

* * * * *

UNITED STATES PATENT AND TRADEMARK OFFICE
CERTIFICATE OF CORRECTION

PATENT NO. : 5,588,011
DATED : December 24, 1996
INVENTOR(S) : Riggle It is certified that error appears in the above-identified patent and that said Letters Patent is hereby corrected as shown below:

On the title page: Item [73] Assignee"s "C.M. Riggle, Colorado Springs, Colo." should read -- MAXTOR Corporation, Longmont, Colo."--.

Signed and Sealed this

Tenth Day of June, 1997

Attest:

BRUCE LEHMAN

*Attesting Officer*   Commissioner of Patents and Trademarks